US012682947B2

(12) United States Patent
Lin et al.

(10) Patent No.: US 12,682,947 B2
(45) Date of Patent: Jul. 14, 2026

(54) MEMORY ARRAY AND MEMORY CELL USED AS PUF MEMORY

(71) Applicant: Winbond Electronics Corp., Taichung City (TW)

(72) Inventors: Lih-Wei Lin, Hsinchu City (TW); Huan-Ming Chiang, Hsinchu City (TW); Shih Jyun Chen, Pingtung (TW)

(73) Assignee: Winbond Electronics Corp., Taichung City (TW)

( * ) Notice: Subject to any disclaimer, the term of this patent is extended or adjusted under 35 U.S.C. 154(b) by 87 days.

(21) Appl. No.: 18/608,939

(22) Filed: Mar. 19, 2024

(65) Prior Publication Data

US 2025/0273264 A1 Aug. 28, 2025

(30) Foreign Application Priority Data

Feb. 26, 2024 (TW) .................................. 113106729

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................. G11C 11/418; G11C 11/419
USPC ...................................................... 365/185.04
See application file for complete search history.

(56) References Cited

U.S. PATENT DOCUMENTS 9,613,714 B1 * 4/2017 Wong ...................... G11C 17/16
9,779,795 B1 * 10/2017 Sadd .................. G11C 13/0028

| | | | |
|---|---|---|---|
| 10,475,491 B2 * | 11/2019 | Chen ...................... | G06F 21/73 |
| 11,404,958 B2 | 8/2022 | Hsu | |
| 2018/0102909 A1 * | 4/2018 | Wu ......................... | G11C 17/16 |
| 2018/0315460 A1 * | 11/2018 | Chen ...................... | G06F 21/73 |
| 2019/0096496 A1 * | 3/2019 | Wong ..................... | G11C 17/18 |
| 2020/0117836 A1 | 4/2020 | Garbe et al. | |
| 2023/0013730 A1 | 1/2023 | Chung et al. | |

FOREIGN PATENT DOCUMENTS

| | | |
|---|---|---|
| TW | 201727657 | 8/2017 |
| TW | 202018704 | 5/2020 |
| TW | I792764 | 2/2023 |
| TW | 202324398 | 6/2023 |

OTHER PUBLICATIONS

"Office Action of Taiwan Counterpart Application", issued on Oct. 29, 2024, p. 1-p. 9.

* cited by examiner

*Primary Examiner* — Sung Il Cho
(74) *Attorney, Agent, or Firm* — JCIPRNET

(57) ABSTRACT

A memory array includes word line sets, each having a first, second, and third word lines; bit line sets, each having a first and second bit lines; and memory cells, each of the memory cells dispose at intersections of each of the word line sets and each of the bit line sets. Each of the memory cells has a first, second, and third control ends that are respectively coupled to the first, second, and third word lines of a corresponding word line set, and a first and second ends that are respectively coupled to the first and second bit lines of a corresponding bit line set. In a differential mode, reading is performed according to reading currents of the first and second ends. In a single-ended mode, reading is performed according to the read currents of the first or second ends and the reference current.

16 Claims, 6 Drawing Sheets

MEMORY ARRAY AND MEMORY CELL USED AS PUF MEMORY

CROSS-REFERENCE TO RELATED APPLICATION

This application claims the priority benefit of Taiwan application serial no. 113106729, filed on Feb. 26, 2024. The entirety of the above-mentioned patent application is hereby incorporated by reference herein and made a part of this specification.

BACKGROUND

Technical Field

The disclosure relates to a memory array and a memory cell.

Description of Related Art

A physical unclonable functions (PUF) memory is currently widely used in applications such as digital ID. In the related art, taking advantage of a mismatch between elements in a manufacturing process, using SRAM or a ring oscillator as the PUF memory. SRAM uses a voltage difference between bit line pairs (BL/BL) of the memory to identify 0 or 1, and the ring oscillator may use two paths to compare which is faster to generate 0 or 1.

The existing PUF memory has issues of poor quality and reliability. In addition, in order to avoid the mismatch between elements, many new PUF memories have been proposed. When designing the PUF memory, it is required to be able to generate 50% of the probability to generate 0 or 1.

In addition, in an existing memory cell structure formed by two transistors, when one of the transistors is read, the other one is prone to generate a leakage current, which will cause a difference value between read currents of the two transistors to become smaller, making a read boundary worse, thereby reducing the reliability.

SUMMARY

Based on the above, the disclosure provides a memory array that may be used as a PUF memory. The memory array may also provide a differential or single-ended operation mode, which may provide about 50% of success probability and reduce leakage current paths.

According to an embodiment of the disclosure, a memory array is provided. The memory array includes multiple word line sets, in which each of the word line sets includes a first word line, a second word line, and a third word line, multiple bit line sets, in which each of the bit line sets includes a first bit line and a second bit line, and multiple memory cells, in which each of the memory cells is respectively disposed at intersections of the word line sets and the bit line sets, and each of the memory cells includes a first control end, a second control end, a third control end, a first end, and a second end. The first control end, the second control end, and the third control end of each of the memory cells are respectively coupled to the first word line, the second word line, and the third word line of a corresponding word line set among the word line sets. The first end and the second end of each of the memory cells are respectively coupled to the first bit line and the second bit line of a corresponding bit line set among the bit line sets. When the memory array operates in a differential mode, reading is performed according to a first reading current of the first end and a second reading current of the second end. When the memory array operates in a single-ended mode, the reading is performed according to a reading current of the first end or the second end and a reference current.

According to an embodiment of the disclosure, a memory cell is provided. The memory cell includes a first control end, a second control end, and a third control end respectively coupled to a first word line, a second word line, and a third word line, and a first end and a second end respectively coupled to a first bit line and a second bit line. When a memory array operates in a differential mode, reading is performed according to a first reading current of the first end and a second reading current of the second end. When the memory array operates in a single-ended mode, the reading is performed according to a reading current of the first end or the second end and a reference current.

Based on the above, according to the embodiments of the disclosure, an architecture of the memory array may be provided, which is suitable for an operation of the PUF memory. The memory array and the memory cells thereof in the disclosure may provide two reading modes, which are differential and single-ended, providing a more flexible operation. In addition, the second transistor in the memory cell may serve as the isolation transistor of the memory cell, which may isolate any small leakage current of the memory cell. As a result, the read boundary of the memory cell may be improved. That is, there is a smaller leakage current loss and a larger read boundary.

DETAILED DESCRIPTION OF DISCLOSED EMBODIMENTS

Figure 1:
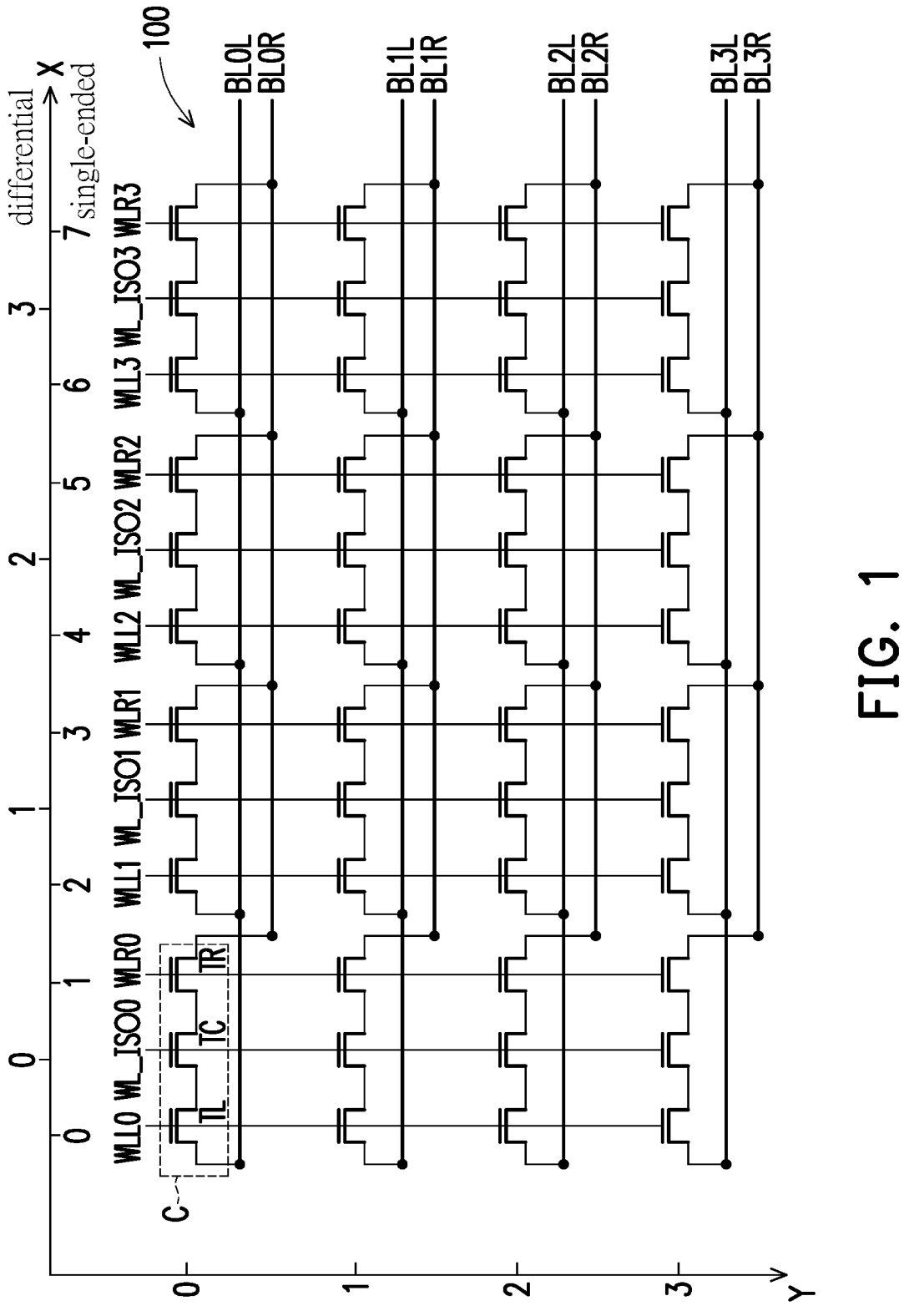
FIG. 1 is a schematic view of an architecture of a memory array according to an embodiment of the disclosure.

As shown in FIG. 1, a memory array 100 includes multiple word line sets WLL0/WL_ISO0/WLR0 to WLL3/WL_ISO3/WLR3, multiple bit line sets BL0L/BL0R to BL3L/BL3R, and multiple memory cells C. The word line sets WLL0/WL_ISO0/WLR0 to WLL3/WL_ISO3/WLR3 extend in a first direction (e.g., a column direction, a Y direction), and the bit line sets BL0L/BL0R to BL3L/BL3R extend in a second direction (e.g., a row direction, an X direction). Each of the memory cells C is respectively disposed at multiple intersections of the word line sets WLL0/WL_ISO0/WLR0 to WLL3/WL_ISO3/WLR3 and the bit line sets BL0L/BL0R to BL3L/BL3R. In this embodiment, the memory array 100 is a 4×4 (4 word line sets and 4 bit line sets) array as an example for description, but it is not intended to limit the implementation of the disclosure.

As shown in FIG. 1, each of the memory cells C is a five-ended element (excluding a base node), which includes a first control end, a second control end, a third control end, a first end, and a second end. As an example, each of the memory cells C includes a first transistor TL, a second transistor TC, and a third transistor TR, which are connected in series to one another. Each of the first transistor TL, the second transistor TC, and the third transistor TR includes a control end (i.e., a gate), such as the above-mentioned first control end, second control end, and third control end. Each of the first transistor TL, the second transistor TC, and the third transistor TR further includes a first source/drain end and a second source/drain end. The first source/drain end of the first transistor TL serves as the first end of the above-mentioned memory cell C, and the second source/drain end of the third transistor TR serves as the second end of the above-mentioned memory cell C.

Hereinafter, the first word line set (WLL0/WL_ISO0/WLR0) and the first bit line set BL0L/BL0R are used for description. Connection methods of the memory cells C of other sets are the same. The gate of each of the first transistor TL, the second transistor TC, and the third transistor TR (i.e., the first control end, the second control end, and the third control end) are respectively coupled to a corresponding word line set, that is, the corresponding first word line set WLL0, WL_ISO0, and WLR0). The first source/drain end of the first transistor TL serves as the first end of the memory cell C, and is coupled to a first bit line of a corresponding bit line set, which is the first bit line BL0L of the first bit line set here. The second source/drain end of the first transistor TL is coupled to the first source/drain end of the second transistor TC. The second source/drain end of the second transistor TC is coupled to the first source/drain end of the third transistor TR. The second source/drain end of the third transistor TR is coupled to the second bit line BL0R of the first bit line set.

In this embodiment, the memory array 100 may be used as a PUF memory. In addition, the above-mentioned second transistor TC is used as an isolation transistor of the memory cell C, and the gate thereof is used for isolation and may isolate any small leakage current of the memory cell C. As a result, a read boundary of the memory cell may be improved. That is, there is a smaller leakage current loss and a larger read boundary.

In addition, each of the bit line sets BL0L/BL0R to BL3L/BL3R of the memory array 100 is coupled to a sense amplifier (see descriptions of FIGS. 4 to 6) to read each of the memory cells C of the memory array 100.

Figure 4:
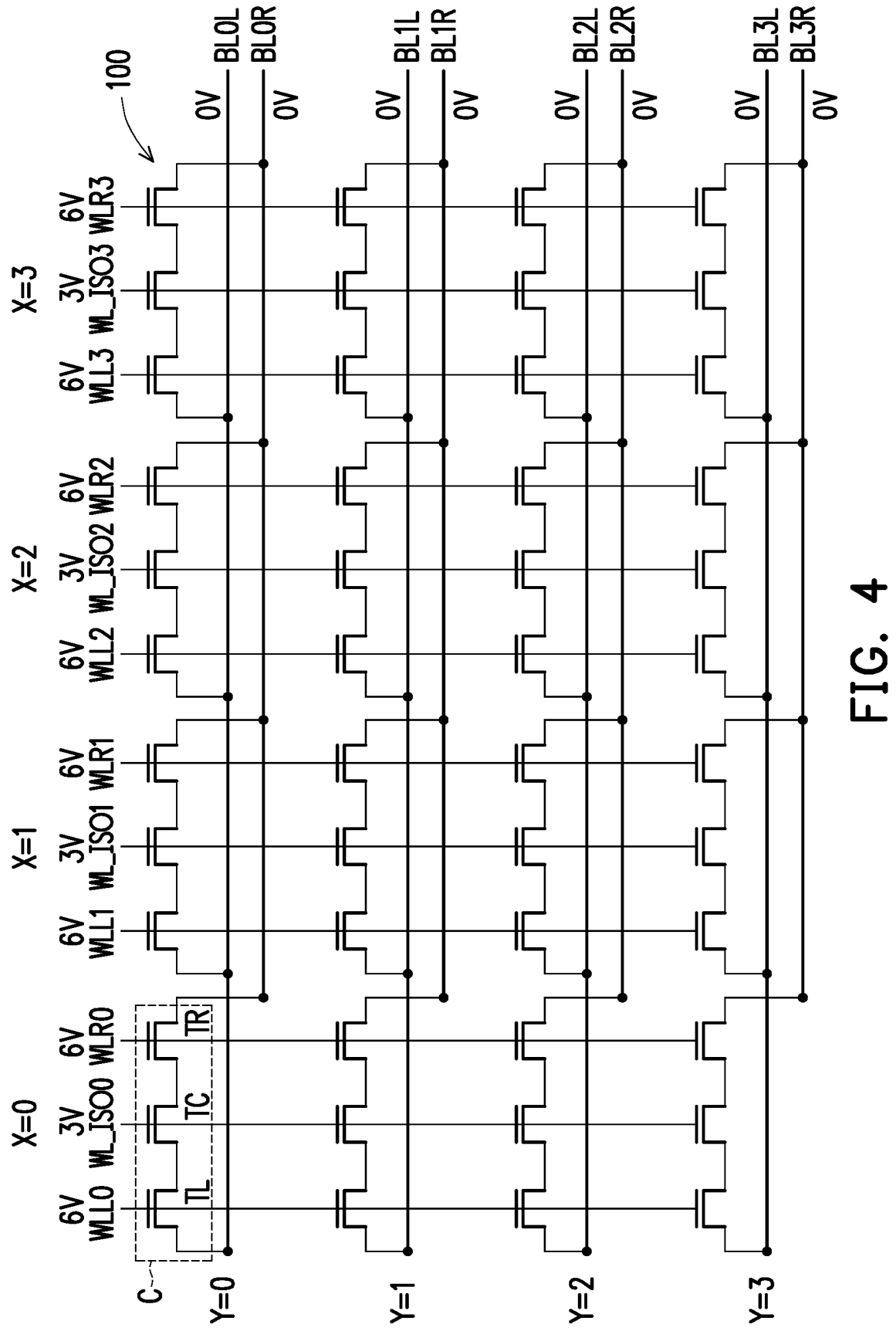
FIG. 4 is a schematic view of an architecture of a memory array being programmed according to an embodiment of the disclosure.
Figure 5:
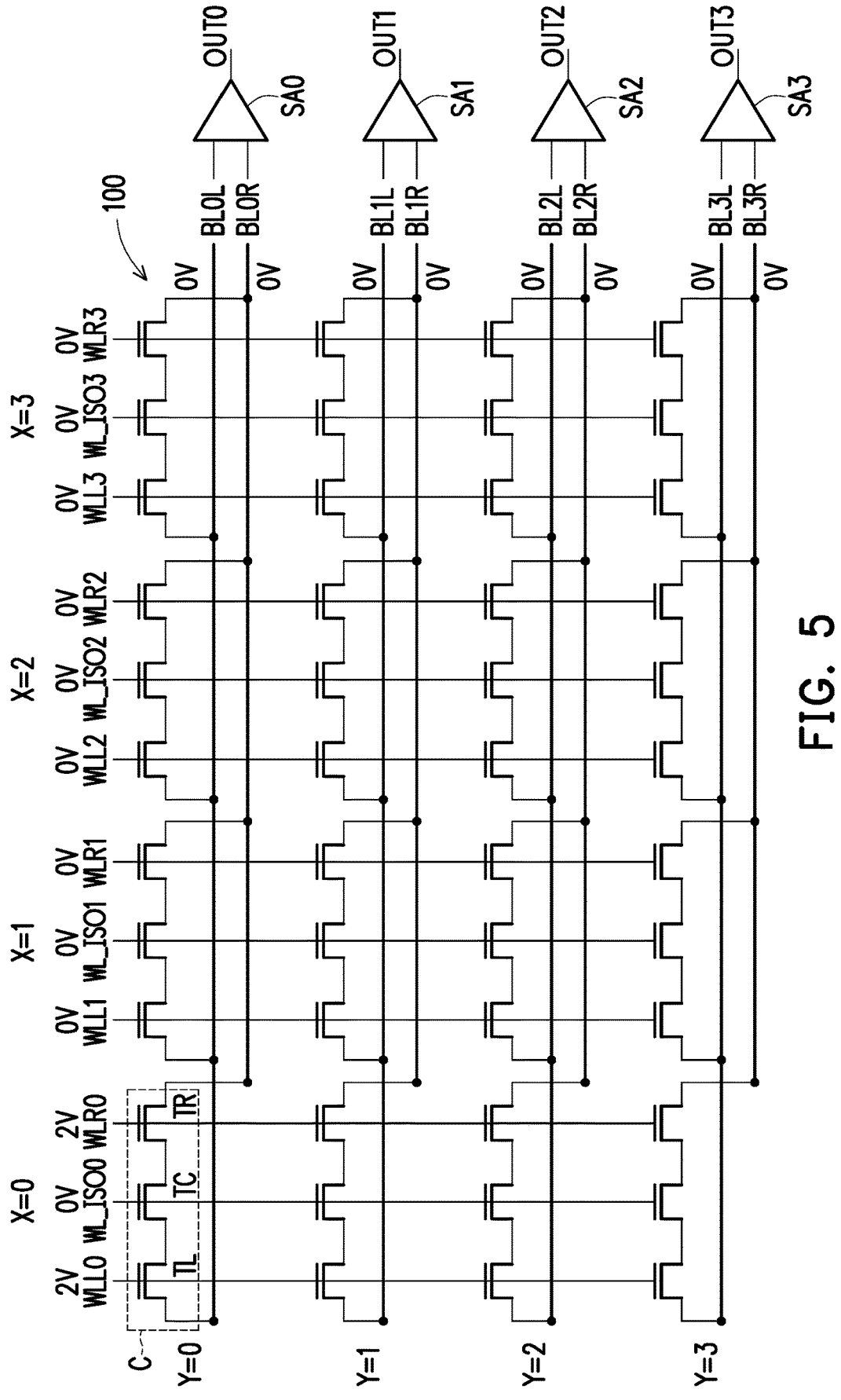
FIG. 5 is a schematic view of an architecture of a memory array being read in a differential mode according to an embodiment of the disclosure.
Figure 6:
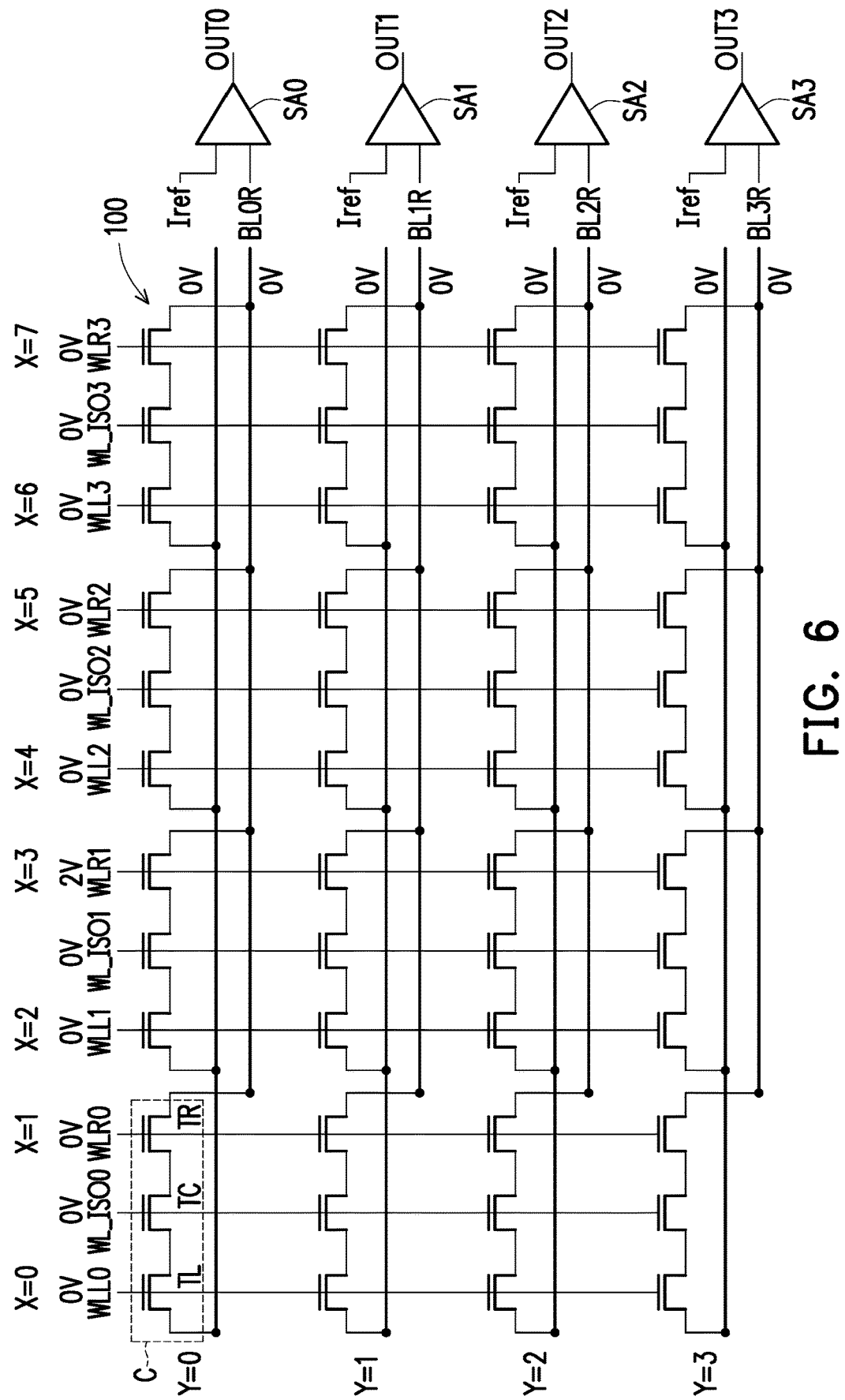
FIG. 6 is a schematic view of an architecture of a memory array being read in a single-ended mode according to an embodiment of the disclosure.

According to the embodiment of the disclosure, depending on whether the memory cell C is a differential architecture or a single-ended architecture, each of the sense amplifiers will also be adjusted accordingly, referring to FIGS. 4 to 6 for details. In this embodiment, the differential architecture is an architecture of one bit and three transistors (3T1b), and the single-ended architecture is an architecture of one bit and 1.5 transistors (1.5T1b).

In order to facilitate the following description, a position of the memory cell C will be expressed in (X, Y) coordinates. As shown in FIG. 1, in the 4×4 memory array, in a case of the differential architecture, it will be represented by X=0~3 (4 bits), and in a case of the single-ended architecture, it will be represented by X=0~7 (8 bits). Here, a size of the memory array 100 is an example for description and is not intended to limit the implementation of the disclosure. The size of the memory array 100 may be adjusted according to actual requirements.

In addition, the size of the memory array 100 used as the PUF memory is not too large. Therefore, when a programming operation is performed on the memory array, voltages may be applied to all the word lines and bit lines, thereby programming all the memory cells C of the memory array 100. In addition, the memory array 100 may also be divided into several smaller sub-arrays, and then all the memory cells C of each of the sub-arrays are programmed.

Figure 2B:
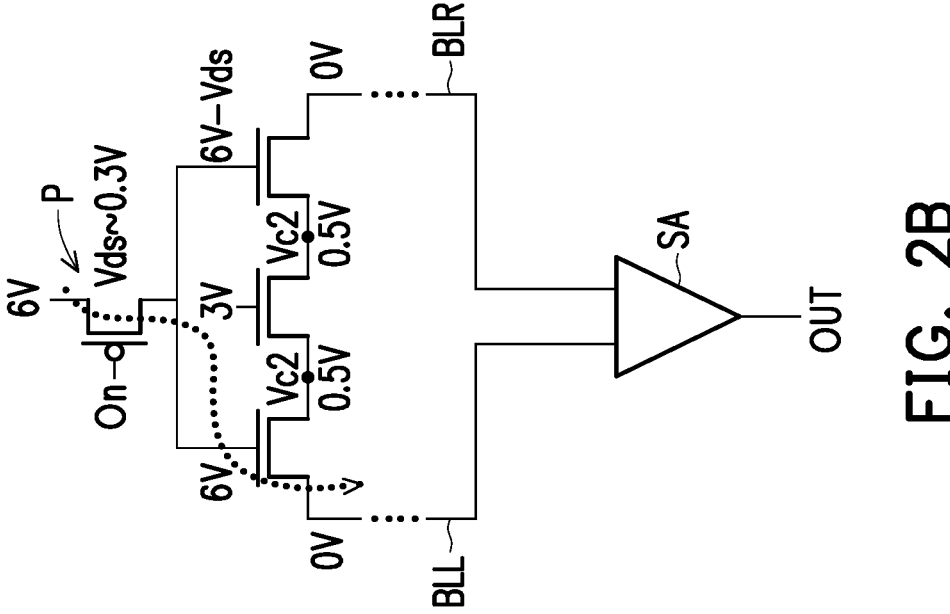
FIGS. 2A and 2B are schematic views of an operation description of a memory cell according to an embodiment of the disclosure.
Figure 2A:
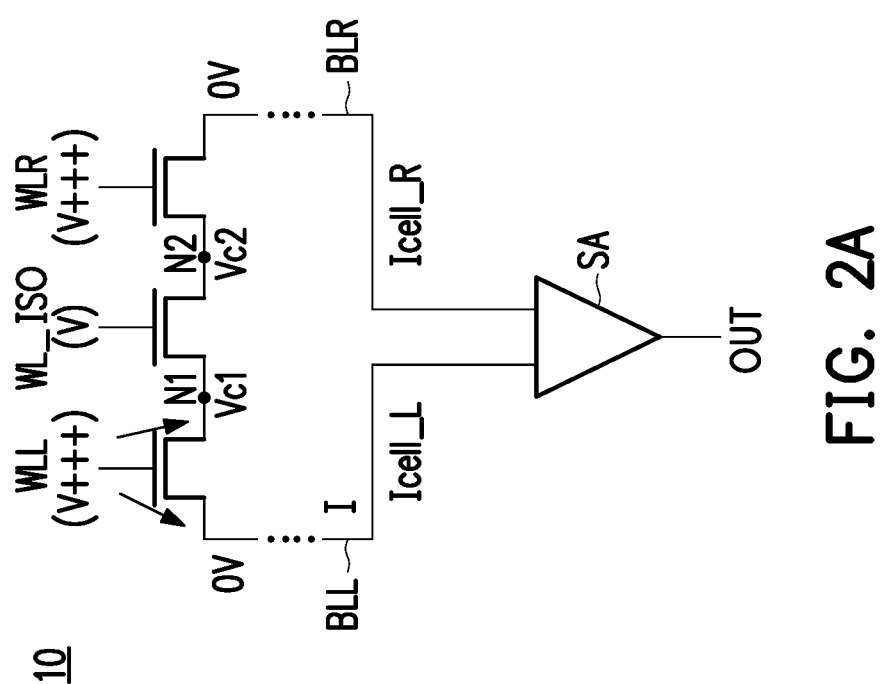

Next, a programming method of the memory cell according to an embodiment of the disclosure will be described with reference to FIGS. 2A and 2B. When the memory cells C are programmed, a first programming voltage is respectively applied to the gates of the first transistor TL and the third transistor TR (respectively coupled to a first word line WLL and a third word line WLR of a word line set), and a second programming voltage is applied to the gate of the second transistor TC (coupled to a second word line WL_ISO of the word line set). Here, a voltage value of the first programming voltage is greater than a voltage value of the second programming voltage. As an example, the voltage value of the second programming voltage is approximately half of the voltage value of the first programming voltage. As an example, the voltage value of the first programming voltage is 6V, and the voltage value of the second programming voltage is 3V. In addition, a bit line voltage is applied to a first bit line BLL and a second bit line BLR, and the bit line voltage is less than the second programming voltage, such as 0V.

When the memory cells C are programmed, one of the first transistor TL and the third transistor TR will breakdown first. At this time, the transistor will be turned on to generate a conductive current. Here, the first transistor TL on the left side in FIG. 2B is turned on first as an example for description. When the first transistor TL is turned on, a current sensing circuit will sense flow of a current. As a result, the programming operation ceases. As an example, the current sensing circuit is a circuit external to the memory array, which in a PUF unit, feedbacks a signal that turns off a programming voltage by comparing the current. In other words, after one of the first transistor TL and the third transistor TR is turned on, application of the programming voltage (e.g., 6V) will be turned off.

In addition, when one of the first transistor TL and the third transistor TR is hard broken down by the current, the current passing through a source-drain voltage Vds of a pull-up PMOS transistor P will cause a voltage drop, for example, Vds is 0.3V. Here, the pull-up PMOS transistor P is an external circuit outside the memory array 100, which mainly means that there will be an external voltage drop Vds of about 0.3V during programming. At this time, as mentioned above, when the first transistor TL is turned on first, the third transistor TR will also cause the first programming voltage applied to the gate of the third transistor TR to drop from 6V to 6V-Vds (approximately 6V–0.3V=5.7V) due to the voltage drop Vds of the PMOS transistor. Therefore, the first programming voltage applied to the gate of the third transistor TR will not be programmed successfully due to the voltage drop.

In this way, the programming of the first transistor TL and the third transistor TR of the memory cell C will be random. At this time, the probability that the transistors on left and right sides of the memory cell C are programmed will be closer to the ideal 50%.

As mentioned above, the second transistor TC is used as the isolation transistor. When the memory cells C are programmed, the voltage (the second programming voltage) applied to the gate of the second transistor TC is less than the first programming voltage applied to the gates of the first transistor TL and the third transistor TR, for example, 3V. At this time, a coupling potential Vc1 between a drain of the first transistor TL and a source of the second transistor TC and an instantaneous coupling potential Vc2 between a drain of the second transistor TC and a source of the third transistor TR are both about 0.5V.

Similarly, taking the first transistor TL on the left to be turned on first as an example for description, the gate thereof is coupled to the first word line WLL, and the first programming voltage is applied, that is, 6V; the source is coupled to the first bit line BLL, the applied voltage is 0V, and the instantaneous coupling potential Vc1 of the drain is 0.5V. At this time, a position where a local electric field of a gate-source voltage Vgs of the first transistor TL is the strongest is close to a left side of the first transistor TL shown in FIG. 2A, and intensity of an electric field close to a right side (close to a node N1) of the first transistor TL shown in FIG. 2A is weaker. In this situation, breakdown of a gate oxide layer of the first transistor TL will be limited to the left side of the first transistor TL. In this way, a current path after the first transistor TL is turned on is concentrated on a gate-bit line path, and a side with the weaker electric field may avoid excessive leakage current paths. Thus, through the above-mentioned second transistor TC (i.e., the isolation transistor), good programming uniformity may be achieved, and the leakage current paths may also be less.

Next, a reading operation of the memory cell according to an embodiment of the disclosure will be described with reference to FIGS. 3A to 3C. As mentioned above, the programmed memory cell C may be read in the differential mode or the single-ended mode. The first bit line BLL coupled to the first end of the memory cell C and the second bit line BLR coupled to the second end are further coupled to an input end of a sense amplifier SA.

Figures 3A, 3B, 3C:
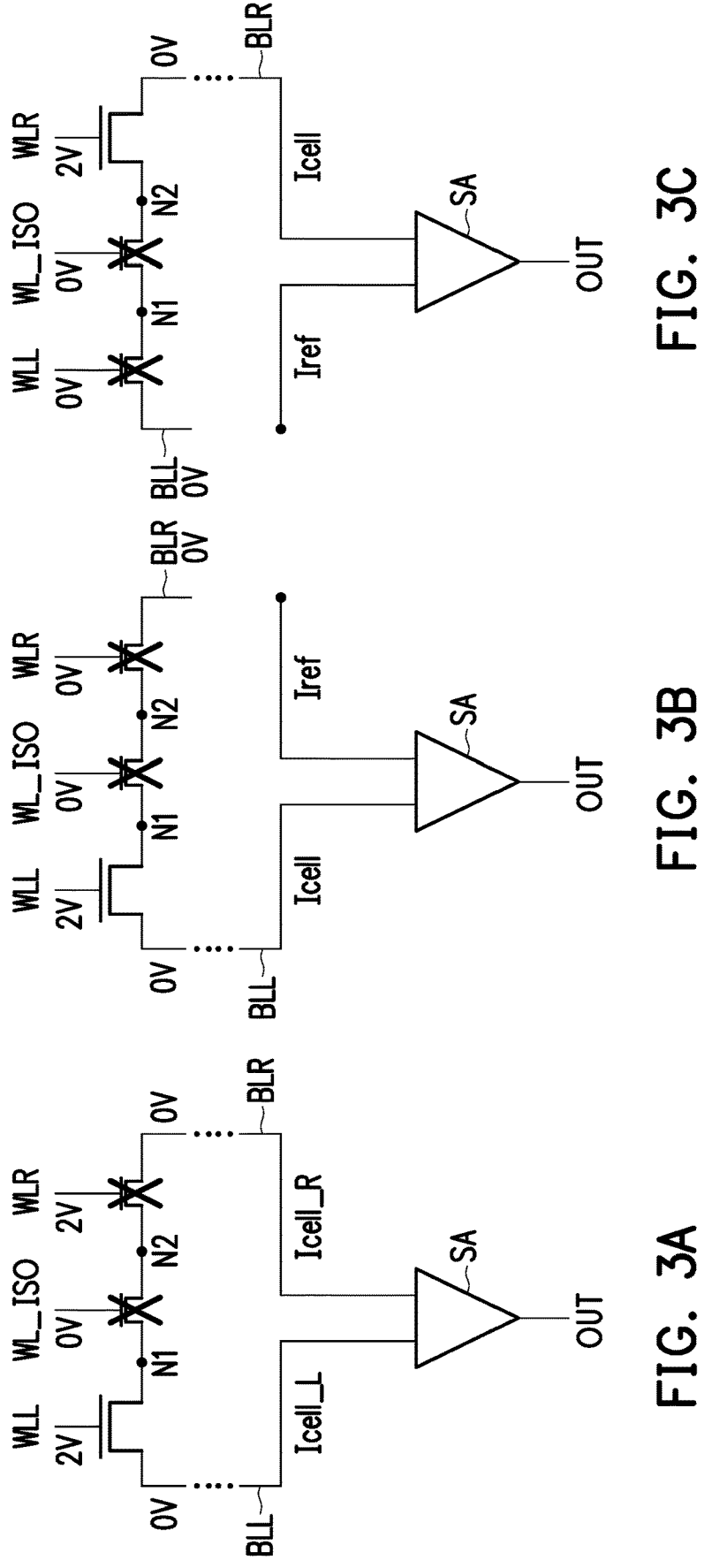
FIGS. 3A to 3C are schematic views of various aspects of applications of a bias voltage during reading of a memory cell according to an embodiment of the disclosure.

As shown in FIG. 3A, the memory cells C operate in the differential mode, and the one successfully programmed may be the first transistor TL or the third transistor TR. As an example, when memory cells C are read, the gate of the first transistor TL (coupled to the first word line WLL) and the gate of the third transistor TR (coupled to the third word line WLR) of the memory cell C are applied with a first reading voltage, and the gate of the second transistor TC (coupled to the second word line WL_ISO) of the memory cell C is applied with a second reading voltage. The first reading voltage is greater than the second reading voltage. The first reading voltage is, for example, 2V, and the second reading voltage is, for example, 0V. In addition, a voltage of 0V is applied to the first bit line BLL and the second bit line BLR.

The first reading voltage may turn on the first transistor TL and the third transistor TR, and the second reading voltage may turn off the second transistor TC. Through turning on the first transistor TL and the third transistor TR, a first reading current Icell_L will flow through the first end of the memory cell C, and a second reading current Icell_R will flow through the second end. After that, the first reading current Icell_L is provided to an input end of the sense amplifier SA through the first bit line BLL, and the second reading current Icell_R is provided to another input end of the sense amplifier SA through the second bit line BLR. The sense amplifier SA outputs a read result from an output end OUT thereof based on a difference value between the first reading current Icell_L and the second reading current Icell_R. Generally speaking, among the first transistor TL and the third transistor TR, the reading current of the successfully programmed transistor will be greater. If the first transistor TL is programmed successfully, the first reading current Icell_L will be greater than the second reading current Icell_R.

In addition, under such operating bias, the second transistor TC as the isolation transistor will be turned off, so nodes N1 and N2 in the memory cell C are equivalent to being turned off. Therefore, the second transistor TC may play an isolation role, and the leakage current paths between the first transistor TL and the second transistor TC and between the second transistor TC and the third transistor TR may be greatly reduced.

As shown in FIG. 3B, the memory cells C operate in the single-ended mode. In this mode, the first bit line BLL coupled to the first end of the memory cell C is further coupled to the input end of the sense amplifier SA. The another input end of the sense amplifier SA is coupled to a reference current Iref. The second bit line BLR coupled to the second end of the memory cell C is not coupled to the sense amplifier SA.

Taking the first transistor TL as an example to be read, when the memory cells C are read, the gate of the first transistor TL (coupled to the first word line WLL) of the memory cell C is applied with the first reading voltage, and the gates of the second transistor TC and the third transistor TR (coupled to the second word line WL_ISO and the third word line WLR respectively) of the memory cell C are applied with the second reading voltage. As mentioned above, the first reading voltage is greater than the second reading voltage. The first reading voltage is, for example, 2V, and the second reading voltage is, for example, 0V. Similarly, 0V is applied to the first bit line BLL and the second bit line BLR.

The first reading voltage may turn on the first transistor TL, and the second reading voltage may turn off the second transistor TC and the third transistor TR. Through turning on the first transistor TL, a reading current Icell will flow through the first end of the memory cell C. After that, the reading current Icell is provided to the input end of the sense amplifier SA through the first bit line BLL, and the another input end of the sense amplifier SA receives the reference current Iref. The sense amplifier SA outputs the read result from the output end OUT thereof based on a comparison between the reading current Icell and the reference current Iref.

In addition, under this operating bias, the second transistor TC and the third transistor TR as the isolation transistors will be turned off, so the nodes N1 and N2 in the memory cell C are equivalent to being turned off. Therefore, the second transistor TC may play the isolation role, and the leakage current paths between the first transistor TL, the second transistor TC, and the third transistor TR may be greatly reduced.

As shown in FIG. 3C, this example is similar to that in FIG. 3B. A difference is that the memory cells C operate in the single-ended mode and reads the third transistor TR. Similar to FIG. 3B, in this mode, the second bit line BLR coupled to the second end of the memory cell C is further coupled to the input end of the sense amplifier SA. The another input end of the sense amplifier SA is coupled to the reference current Iref. The first bit line BLL coupled to the first end of the memory cell C is not coupled to the sense amplifier SA.

Taking the third transistor TR as an example to be read, when the memory cells C are read, the gate of the third transistor TR (coupled to the third word line WLR) of the memory cell C is applied with the first reading voltage, and the gates of the first transistor TL and the second transistor TC (coupled to the first word line WLL and the second word line WL_ISO respectively) of the memory cell C are applied with the second reading voltage. Similarly, the first reading voltage is greater than the second reading voltage. The first reading voltage is, for example, 2V, and the second reading voltage is, for example, 0V. Similarly, 0V is applied to the first bit line BLL and the second bit line BLR.

The first reading voltage may turn on the third transistor TR, and the second reading voltage may turn off the first transistor TL and the second transistor TC. Through turning on the third transistor TR, the reading current Icell will flow through the second end of the memory cell C. After that, the reading current Icell is provided to the input end of the sense amplifier SA through the second bit line BLR, and the another input end of the sense amplifier SA receives the reference current Iref. The sense amplifier SA outputs the read result from the output end OUT thereof based on the comparison between the reading current Icell and the reference current Iref.

In addition, under this operating bias, the second transistor TC and the first transistor TL as the isolation transistors will be turned off, so the nodes N1 and N2 in the memory cell C are equivalent to being turned off. Therefore, the second transistor TC may play the isolation role, and the leakage current paths between the third transistor TR, the second transistor TC, and the first transistor TL may be greatly reduced.

Therefore, through the implementation of the disclosure, regardless of whether the memory cells C are read in the differential mode or the single-ended mode, the read boundary of the memory cell may be improved. That is, there is the smaller leakage current loss and the larger read boundary.

Next, the programming method of the memory array according to an embodiment of the disclosure will be described with reference to FIG. 4. FIG. 4 shows the 4×4 memory array 100. The architecture thereof is as shown in FIG. 1, which will not be further described in the following, and the marking of the sense amplifier is omitted. Here, a one-time programming operation on the entire memory array 100 is used for description.

During programming, a programming voltage is applied to each of the set word line sets of the memory array 100. The programming voltage includes the first programming voltage and the second programming voltage. As mentioned above, the first programming voltage may be, for example, 6V, and the second programming voltage may be, for example, 3V. During programming, the first programming voltage is applied to the first word lines WLL0 to WLL3 and the third word lines WLR0 to WLR3 of each of the word line sets, and the second programming voltage is applied to the second word lines WL_ISO0 to WL_ISO3 of each of the word line sets. In addition, during programming, the voltage of 0V is applied to the first bit lines BL0L to BL3L and the second bit lines BL0R to BL3R in each of bit line sets. Through such biasing method, all the memory cells C of memory array 100 are programmed.

In this way, the programming of the first transistor TL and the third transistor TR of each of the memory cells C in the memory array 100 will be random. At this time, the probability that the first transistor TL and the third transistor TR on the left and right sides of memory cell C are programmed will be closer to the ideal 50%, which may better meet requirements of the PUF memory.

Next, a method of applying a bias voltage of a reading method of the memory array in the differential mode will be described with reference to a schematic view in FIG. 5. In this example, a first bit line BLiL and a second bit line BLiR of each of the bit line sets are further coupled to an input end of a corresponding sense amplifier SAi, where i=0~3. In the differential mode, it is equivalent to the 4×4 memory array (i.e., X=0~3, Y=0~3). As shown in FIG. 5, it is assumed that the memory cells C at (X, Y)=(0, 0) are to be read. That is, the memory cells C at the intersection of the first word line set (i.e., the first word line WLL0, the second word line WL_ISO0, and the third word line WLR0) and the first bit line set (i.e., the first bit line BL0L and the second bit line BL0R) are selected to be read, and other memory cells C are in a non-selected state.

Therefore, in the memory array 100, only the first word line WLL0 and the third word line WLR0 of the first word line set are applied with the above-mentioned first reading voltage, for example, 2V, while the second word line WL_ISO0 is applied with the second reading voltage, for example, 0V. In addition, each of the remaining unselected word line sets, that is, WLL1 to WLL3, WL_ISO1 to WL_ISO3, and WLR1 to WLR3, is applied with a non-selected voltage, for example, 0V. As a result, each of the transistors in the memory cell C that is not selected is turned off. In addition, during the reading operation, the bit line voltage, for example, 0V, is applied to the first bit lines BL0L to BL3L and the second bit lines BL0R to BL3R of each of the bit line sets. As a result, the selected memory cells C are read through the above-mentioned biasing method.

When the first transistor TL and the third transistor TR are turned on, the first reading current Icell_L flowing out from the first end is provided to an input end of a sense amplifier SA0 through the first bit line BL0L, while the second reading current Icell_R flowing out from the second end is provided to another input end of the sense amplifier SA0 through the second bit line BL0R. As a result, based on the difference value between the first reading current Icell_L and the second reading current Icell_R of the memory cell C, it may be determined that the bit stored in the memory cell C is 1 or 0. Therefore, 1 or 0 may be output from an output end OUT0 of the sense amplifier SA0. In addition, under such bias condition, data stored in other memory cells C (at (X=0, Y=1~3)) connected to this word line set WLL0, WL_ISO0, and WLR0 may also be output through output ends OUT1 to OUT3 of sense amplifiers SA1 to SA3 respectively.

Next, the method of applying the bias voltage of the reading method of the memory array in the single-ended mode will be described with reference a schematic view in FIG. 6. In this example, the first bit line BLiL or the second bit line BLiR of each of the bit line sets is further coupled to the input end of the corresponding sense amplifier SAi, where i=0~3. In this example, it is taken that the second bit line BLiR of each of the bit line sets is coupled to the input end of the corresponding sense amplifier SAi as an example. Of course, It may also be that the first bit line BLiL of each of the bit line sets is coupled to the input end of the corresponding sense amplifier SAi. In the single-ended mode, it is equivalent to a 8×4 memory array (i.e., X=0~7, Y=0~3). In addition, FIG. 6 is an example of reading the data stored in the right transistor in the memory cell C. The same method is also used to read the data stored in the left transistor, and the descriptions of FIGS. 3B and 3C may be referred for the specific method.

As shown in FIG. 6, it is assumed that each of the memory cells C at (X, Y)=(3, 0) is to be read. That is, the third transistor TR on the right side of the memory cell C at the intersection of the second word line set (i.e., the first word line WLL1, the second word line WL_ISO1, and the third word line WLR1) and the first bit line set (i.e., the first bit line BL0 and the second bit line BL0R) is selected to be read, and other memory cells C are in the non-selected state.

Here, in the memory array 100, only the third word line WLR1 of the second word line set is applied with the above-mentioned first reading voltage, for example, 2V, while the first word line WLL1 and the second word line WL_ISO1 are applied with the second reading voltage. The second reading voltage is less than the first reading voltage, for example, 0V. In addition, each of the remaining unselected word line sets, that is, WLL0, WLL2 to WLL3, WL_ISO0, WL_ISO2 to WL_ISO3, WLR0, WLR2 to WLR3, is applied with the non-selected voltage, for example, 0V. As a result, each of the transistors in memory cells C that is not selected is turned off. In addition, during the reading operation, the bit line voltage, for example, 0V, is applied to the first bit lines BL0L to BL3L and the second bit line BL0R to BL3R of each of the bit line sets. As a result, the selected memory cells C are read through this biasing method.

When the third transistor TR is turned on, the reading current Icell flowing out from the second end is provided to the input end of the sense amplifier SA0 through the second bit line BL0R, and the another input end of the sense amplifier SA0 receives the reference current Iref. In this way, based on a difference value between the reading current Icell and the reference current Iref, it may be determined that the bit stored in the memory cell Cis 1 or 0. As a result, 1 or 0 is output from the output end OUT0 of the sense amplifier SA0. In addition, under this bias condition, the data stored in other memory cells C (the single-ended mode, the transistor TR at (X=3, Y=1~3)) connected to this word line sets WLL1, WL_ISO1, and WLR1 may also be output through the output end OUT1 to OUT3 of the sense amplifier SA1 to SA3 respectively.

Based on the above, according to the embodiments of the disclosure, the memory array and the memory cells thereof in the disclosure may provide two reading modes, which are differential and single-ended, providing a more flexible operation. In addition, the second transistor in the memory cell may serve as the isolation transistor of the memory cell, which may isolate any small leakage current of the memory cell. As a result, the read boundary of the memory cell may be improved. That is, there is a smaller leakage current loss and a larger read boundary.

What is claimed is:

1. A memory array, comprising:
a plurality of word line sets, wherein each of the word line sets comprises a first word line, a second word line, and a third word line;
a plurality of bit line sets, wherein each of the bit line sets comprises a first bit line and a second bit line; and
a plurality of memory cells, wherein each of the memory cells is respectively disposed at intersections of the word line sets and the bit line sets, and each of the memory cells comprises a first control end, a second control end, a third control end, a first end, and a second end,
wherein the first control end, the second control end, and the third control end of each of the memory cells are respectively coupled to the first word line, the second word line, and the third word line of a corresponding word line set among the word line sets,
wherein the first end and the second end of each of the memory cells are respectively coupled to the first bit line and the second bit line of a corresponding bit line set among the bit line sets,
wherein each of the memory cells comprises a first transistor, a second transistor, and a third transistor connected in series to one another, a first source/drain end of the first transistor serves as the first end, and is directly connected to the first bit line of the corresponding bit line set among the bit line sets, a second source/drain end of the first transistor is directly connected to a first source/drain end of the second transistor, a second source/drain end of the second transistor is directly connected to a first source/drain end of the third transistor, a second source/drain end of the third transistor serves as the second end, and is directly connected to the second bit line of the corresponding bit line set, the second transistor serves as an isolation transistor configured to isolate a current path between the first end and the second end during a reading operation,
when the memory array operates in a differential mode, reading is performed according to a first reading current of the first end and a second reading current of the second end, and
when the memory array operates in a single-ended mode, the reading is performed according to a reading current of the first end or the second end and a reference current.

2. The memory array according to claim 1, wherein a gate of each of the first transistor, the second transistor, and the third transistor serves as the first control end, the second control end, and the third control end respectively.

3. The memory array according to claim 1, further comprising a plurality of sense amplifiers corresponding to the bit line sets,
wherein each of the sense amplifiers has a first input end, a second input end, and an output end,
wherein the first input end and the second input end of each of the sense amplifiers are respectively coupled to the first bit line and the second bit line of the corresponding bit line set to receive the first reading current flowing through the first end and the second reading current flowing through the second end, and
based on a difference value between the first reading current and the second reading current, the output end outputs a read result.

4. The memory array according to claim 1, further comprising a plurality of sense amplifiers corresponding to the bit line sets,
wherein each of the sense amplifiers has a first input end, a second input end, and an output end,
wherein the first input end of each of the sense amplifiers is coupled to the first bit line or the second bit line of the corresponding bit line set to receive the reading current flowing through the first end or the second end,
the second input end of each of the sense amplifiers is coupled to the reference current, and
based on the reading current and the reference current, the output end outputs a read result.

5. The memory array according to claim 1, wherein when the memory cells are programmed,
a first programming voltage is applied to the first word line and the third word line of each of the word line sets, a second programming voltage is applied to the second word line, and the second programming voltage is less than the first programming voltage, and a bit line voltage is applied to the first bit line and the second bit line of each of the bit line sets, and the bit line voltage is less than the second programming voltage.

6. The memory array according to claim 1, wherein performing the reading on a selected memory cell of the memory cells in the differential mode further comprises:

selecting a word line set corresponding to a read memory cell among the memory cells;

applying a first reading voltage to the first word line and the third word line of the word line set and applying a second reading voltage to the second word line, wherein the second reading voltage is less than the first reading voltage;

applying a non-selected voltage to unselected word line sets among the word line sets;

applying a bit line voltage to the first bit line and the second bit line of each of the bit line sets;

sensing the first reading current flowing through the first end and the second reading current flowing through the second end; and based on a difference value between the first reading current and the second reading current, reading the selected memory cell.

7. The memory array according to claim 1, wherein performing the reading on a selected memory cell of the memory cells in the single-ended mode further comprises:

selecting a word line set corresponding to a read memory cell among the memory cells;

applying a first reading voltage to one of the first word line and the third word line of the word line set, applying a second reading voltage to the second word line, and applying the second reading voltage to the other one of the first word line and the third word line, wherein the second reading voltage is less than the first reading voltage;

applying a non-selected voltage to unselected word line sets among the word line sets;

applying a bit line voltage to the first bit line and the second bit line of each of the bit line sets;

sensing the reading current flowing through the first end or the second end; and based on a comparison between the reading current and the reference current, reading the selected memory cell.

8. The memory array according to claim 1, wherein the memory array is used as a physical unclonable functions memory.

9. A memory cell, comprising:

a first control end, a second control end, and a third control end respectively coupled to a first word line, a second word line, and a third word line;

a first end and a second end respectively coupled to a first bit line and a second bit line; and a first transistor, a second transistor, and a third transistor connected in series to one another, wherein a first source/drain end of the first transistor serves as the first end, and is directly connected to the first bit line of the corresponding bit line set among the bit line sets, a second source/drain end of the first transistor is directly connected to a first source/drain end of the second transistor, a second source/drain end of the second transistor is directly connected to a first source/drain end of the third transistor, a second source/drain end of the third transistor serves as the second end, and is directly connected to the second bit line of the corresponding bit line set, the second transistor serves as an isolation transistor configured to isolate a current path between the first end and the second end during a reading operation, wherein when a memory array operates in a differential mode, reading is performed according to a first reading current of the first end and a second reading current of the second end, and when the memory array operates in a single-ended mode, the reading is performed according to a reading current of the first end or the second end and a reference current.

10. The memory cell according to claim 9, wherein a gate of each of the first transistor, the second transistor, and the third transistor serves as the first control end, the second control end, and the third control end respectively.

11. The memory cell according to claim 9, wherein the memory cell is coupled to a sense amplifier through the first bit line and second bit line, the sense amplifier has a first input end, a second input end, and an output end, the first input end and the second input end of the sense amplifier are respectively coupled to the first bit line and the second bit line to receive the first reading current flowing through the first end and the second reading current flowing through the second end, and based on a difference value between the first reading current and the second reading current, the output end outputs a read result.

12. The memory cell according to claim 9, wherein the memory cell is coupled to a sense amplifier through the first bit line or the second bit line, the sense amplifier has a first input end, a second input end, and an output end, the first input end of the sense amplifier is coupled to the first bit line or the second bit line to receive the reading current flowing through the first end or the second end, the second input end of the sense amplifier is coupled to the reference current, and based on the reading current and the reference current, the output end outputs a read result.

13. The memory cell according to claim 9, wherein when the memory cells are programmed, a first programming voltage is applied to the first word line and the third word line, a second programming voltage is applied to the second word line, and the second programming voltage is less than the first programming voltage, and a bit line voltage is applied to the first bit line and the second bit line, and the bit line voltage is less than the second programming voltage.

14. The memory cell according to claim 9, wherein performing the reading on the memory cell in the differential mode further comprises:

applying a first reading voltage to the first word line and the third word line and applying a second reading voltage to the second word line, wherein the second reading voltage is less than the first reading voltage;

applying a bit line voltage to the first bit line and the second bit line;

sensing the first reading current flowing through the first end and the second reading current flowing through the second end; and based on a difference value between the first reading current and the second reading current, reading the memory cell.

15. The memory cell according to claim 9, wherein performing the reading on the memory cell in the single- ended mode further comprises:

applying a first reading voltage to one of the first word line and the third word line, applying a second reading voltage to the second word line, and applying the second reading voltage to the other one of the first word line and the third word line, wherein the second reading voltage is less than the first reading voltage;

applying a bit line voltage to the first bit line and the second bit line;

sensing the reading current flowing through the first end or the second end; and based on a comparison between the reading current and the reference current, reading the selected memory cell.

16. The memory cell according to claim 9, wherein the memory cell is used as a physical unclonable functions memory.

\* \* \* \* \*